(12) United States Patent
Huang et al.

(10) Patent No.: US 8,890,254 B2
(45) Date of Patent: Nov. 18, 2014

(54) AIRGAP STRUCTURE AND METHOD OF MANUFACTURING THEREOF

(75) Inventors: Yu-Fong Huang, Tainan (TW); Kun-Mou Chan, Kaohsiung (TW); Tzung-Ting Han, Yilan County (TW)

(73) Assignee: Macronix International Co., Ltd., Hsin-Chu (TW)

( * ) Notice: Subject to any disclaimer, the term of this patent is extended or adjusted under 35 U.S.C. 154(b) by 71 days.

(21) Appl. No.: 13/617,643

(22) Filed: Sep. 14, 2012

(65) Prior Publication Data

US 2014/0077304 A1    Mar. 20, 2014

(51) Int. Cl.
*H01L 21/70*     (2006.01)
*H01L 29/788*    (2006.01)
*H01L 21/336*    (2006.01)
*H01L 21/3205*   (2006.01)

(52) U.S. Cl.
USPC ............ 257/368; 257/315; 438/257; 438/585

(58) Field of Classification Search
CPC ........................... H01L 27/088; H01L 21/283
USPC ........................ 257/368, 315; 438/257, 585
See application file for complete search history.

(56) References Cited

U.S. PATENT DOCUMENTS

| 4,992,391 | A  | * | 2/1991  | Wang ............................ 438/257 |
| 6,326,661 | B1 | * | 12/2001 | Dormans et al. .............. 257/315 |
| 2003/0151069 | A1 | * | 8/2003 | Sugimae et al. .............. 257/200 |
| 2005/0023597 | A1 | * | 2/2005 | Kutsukake et al. ........... 257/315 |
| 2007/0184615 | A1 | * | 8/2007 | Brazzelli et al. .............. 438/266 |
| 2009/0004814 | A1 | * | 1/2009 | Kim et al. ...................... 438/424 |
| 2009/0087983 | A1 | * | 4/2009 | Lee et al. ....................... 438/655 |
| 2010/0295113 | A1 | * | 11/2010 | Kang et al. .................... 257/316 |
| 2011/0303967 | A1 | * | 12/2011 | Harari et al. ................... 257/321 |
| 2011/0309425 | A1 | * | 12/2011 | Purayath et al. .............. 257/316 |

OTHER PUBLICATIONS

Aric C. Madayag and Zhiping Zhou, "Optimization of Spin on Glass Process for Multilevel Metal Interconnect", University/Goverment/Industry Microelectronics Symposium, 2001. Proceedings of the Fourteenth Biennial (Jun. 2001).*

* cited by examiner

*Primary Examiner* — Long K Tran
*Assistant Examiner* — Dzung Tran
(74) *Attorney, Agent, or Firm* — Alston & Bird LLP

(57) ABSTRACT

A process for fabricating a gate structure, the gate structure having a plurality of gates defined by a network of spaces. The word line (WL) spaces within a dense WL region having airgaps and those spaces outside of the dense WL being substantially free of airgaps. A gate structure having a silicide layer dispose across the plurality of gates is also provided.

11 Claims, 8 Drawing Sheets

AIRGAP STRUCTURE AND METHOD OF MANUFACTURING THEREOF

TECHNOLOGICAL FIELD

The present invention generally relates to a semiconductor device and a process and a method of forming a semiconductor device. In particular, the present invention relates to a semiconductor device having an airgap structure and a process and a method for fabricating a semiconductor having an airgap structure.

BACKGROUND

A semiconductor device may comprise a gate structure having a multiplicity of gates, or memory cell gates, which are used to electronically store data. A word line (WL) typically is disposed along the tops of many—perhaps hundreds or even thousands—of these memory cell gates. FIG. 1 represents a cross-sectional view of a gate structure showing a plurality of gates or memory cell gates. The gate structure 1 of FIG. 1 has a plurality of gates 10 disposed on a substrate 20 and defined by a space 30. The plurality of gates 10 may comprise a tunnel oxide layer 50, a floating gate 60, an oxide/nitride/oxide (ONO) laminate layer 70, and a control gate 80. The WL (not shown) would eventually be formed above the finished structure.

Differences in gate space geometries and variability in WL space sizes can lead to vastly different charge buildup in the isolation oxide resulting in unexpected responses of the semiconductor gate response in operation. Indeed these differences may be based upon a needed design of the semiconductor.

"WL capacitance" refers to the capacitance between the word line and adjacent control gates. When the separation between two adjacent control gates is reduced, the structure is deemed to be a "dense WL" and the risk of interference between the WL capacitances for the control gates increases. For example, gates between the spaces 40 of FIG. 1 indicate a dense WL region 100 or a region where there is an increased risk of WL interference.

The remains a need in the art for an improved gate structure that reduces the risk of interference between word line particularly in dense WL structures. There remains a need in the art for an improved system, process or method for fabricating a semiconductor having a plurality of airgaps.

Salicide, or a self-aligned silicide, layer may be applied in the formation of a semiconductor device or gate structure to reduce resistance and provide good ohmic contacts. For example, a cobalt containing silicide applied to a transistor or gate that has been isolated from other gates using WL spaces may serve to reduce the resistance of the gate electrode. However, application of a cobalt containing silicide layer to a semiconductor device itself may not be sufficient to reduce interference especially gate structures having dense WL structures. There remains a need in the art for improved gate structures and methods of fabricating such structures to reduce the extent of interference, in particular, in gates structures having dense WL regions.

BRIEF SUMMARY OF EXEMPLARY EMBODIMENTS

Embodiments of the present invention are therefore provided that may provide for an airgap in a semiconductor device.

An aspect of the invention provides a gate structure comprising a plurality of gates defined by a network of spaces with each gate of the plurality of gates having a dielectric layer, a conductive layer disposed on the dielectric layer, and a silicide layer disposed on the conductive layer. The gate structure also comprises a dense word line (WL) region defined by at least two gates of the plurality of gates and an airgap that is formed between the at least two gates where the airgap is defined by a deposited layer. In an embodiment of the invention, the deposited layer defining the airgap is deposited using a chemical vapor deposition (CVD) process.

In certain embodiments of the invention, any two gates outside of the dense WL region are defined by a space structure having a sidewall and a spacer disposed substantially about the sidewall. The spacer may comprise the deposited layer. Additionally, the spacer may comprise a buffer oxide layer and a liner silicon nitride film. A high density plasma dielectric material may fill any gaps that are in the space structure.

The gate structure may additionally comprise an interlayer dielectric disposed across the gate structure. For example, the interlayer dielectric film may comprise a buffer oxide layer, a liner silicon nitride film, and at least one of a silicon oxide layer and an undoped silicon glass layer. In an embodiment of the invention, the airgap may extend into the buffer oxide layer.

An aspect of the invention provides a method of fabricating a gate structure comprising the steps of providing a gate structure assembly having a plurality of gates disposed across a substrate defined by a network of spaces, the gate structure assembly defined by a dense WL region; applying a deposition layer to form void spaces in any space in the dense WL region; forming a first interlayer dielectric across the gate structure; removing a cap layer disposed on the gate structure to form openings in the void spaces; and constructing a silicide layer on the plurality of gates.

In certain embodiments of the invention, the method of fabricating a gate structure may additionally comprise the steps of applying a fill material to fill the void spaces; removing any excess fill material from the gate structure; and forming an oxide recess over the network of spaces. In certain embodiments of the invention, the fill material may be removed from the void spaces to form a plurality of airgaps.

In certain embodiments of the invention, the fill material may be a spin-on dielectric material. In certain embodiments of the invention the step of applying a fill material to fill the void spaces may comprise the steps of spinning on the spin-on dielectric material, baking the spin-on dielectric material, and curing the spin-on dielectric material.

In an embodiment of the invention, the method of fabricating a gate structure may include the step of forming second interlay dielectric across the gate structure. In certain embodiments of the invention, the deposition layer is applied using a CVD process.

In an embodiment of the invention, the silicide may comprise cobalt. In certain embodiments of the invention, the step of constructing a silicide layer on the plurality of gates comprises applying a layer of cobalt across the gate structure, heating the control gate using a first rapid thermal process, removing unreacted cobalt from the gate structure, and heating the control gate using a second rapid thermal process.

Further pursuant to this embodiment, the first rapid thermal process may operate at a temperature in a range of from about 400° C. to about 680° C. for an amount of time in a range of from about 10 seconds to about 40 seconds, while the second rapid thermal process may operate at a temperature in a range of from about 700° C. to about 950° C. for an amount of time in a range of from about 30 seconds to about 60 seconds.

An aspect of the invention provides fabricating a semiconductor device using any of the methods of the invention.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "an airgap" includes a plurality of such airgaps.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As may be used interchangeably herein, "space" or "WL space" is intended to mean the WL spaces defining certain gate structures of a semiconductor. Generally, a WL space is defined by a sidewall and a bottom. However, in some WL spaces, depending on the aspect ratio and depth of the space, the formation of a distinct bottom portion, in some cases, may not be clearly distinguishable from the convergence of the sidewalls at the bottom portion of the space.

The invention is directed to a semiconductor device having spaces formed within its structure and a system, process, and method of fabricating such a device.

Figure 12:
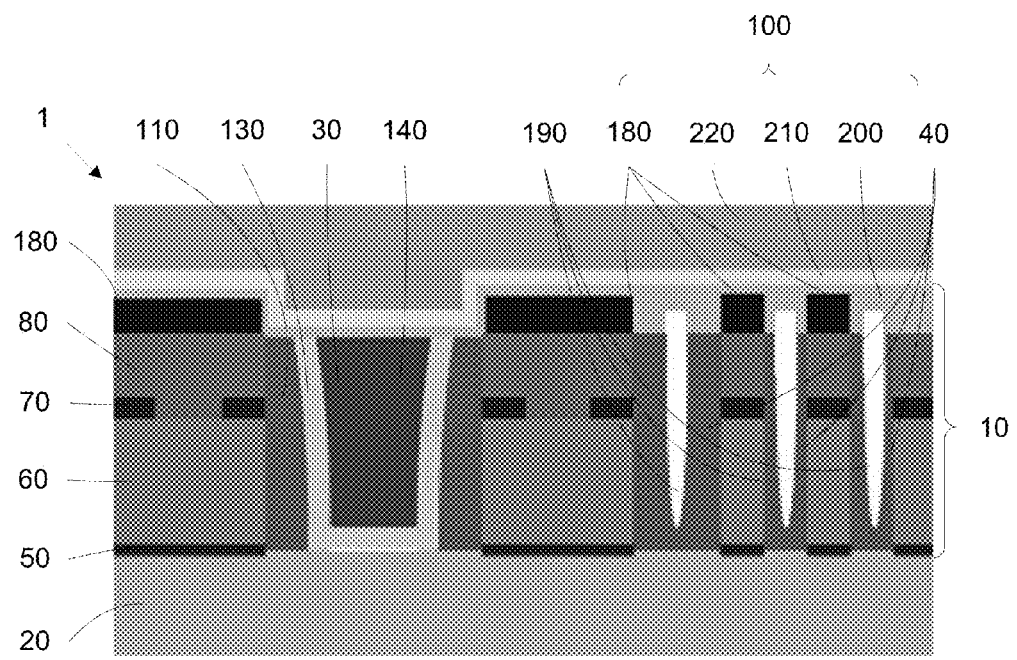
FIG. 12 illustrates a cross-sectional view of a gate structure following formation of another interlayer dielectric according to an embodiment of the invention.

A cross-sectional view of a portion of a gate structure of an exemplary embodiment of the semiconductor device is shown in FIG. 12. This exemplary illustration shows a gate structure 1 having a plurality of gates 10 disposed on a substrate 20 and defined by a network of spaces having, for example, a space 30 outside of a dense word line (WL) region 100 and WL spaces 40 within the dense WL region 100.

The plurality of gates 10 generally each have a first dielectric layer, a first conductive layer, a second dielectric layer, and a second conductive layer. More specifically, the first dielectric layer may be a tunnel oxide layer 50, the first conductive layer may be a floating gate 60, the second dielectric layer may be an oxide/nitride/oxide (ONO) layer 70, and the second conductive layer may be a control gate 80.

Each of the plurality of gates may additionally comprise a silicide layer 180 dispose on the second conductive layer. A plurality of airgaps 190 may be formed within the WL spaces 40 of the dense WL region 100. The plurality of airgaps 190 are defined by a deposited layer 110. In an embodiment of the invention, the deposited layer 110 is deposited using a chemical vapor deposition (CVD) process.

Any two gates outside of the dense WL region 100 may be defined by the space 30, the space 30 being at least defined by a sidewall and possibly a distinct bottom. The space 30 may further comprise a spacer disposed substantially about the sidewall. In certain embodiments of the invention, the spacer comprises the deposited layer 110. The spacer may also additionally comprise a buffer oxide layer and a line silicon nitride film 130 conformally dispose about the sidewall and the bottom of the space. In certain embodiments of the invention, any space 30 outside of the dense WL region 100 are substantially free of any airgaps. In certain embodiments of the invention, a high density plasma dielectric material 140 may fill any gaps in the space 30.

In an embodiment of the invention, an interlayer dielectric is disposed across the gate structure 1. In certain embodiments of the invention, the interlayer dielectric may comprise any one or any combination of a buffer oxide layer 200, a liner silicon nitride film 210, and a third layer 220 that may include any one of a silicon oxide layer, an undoped silicon glass layer, and any combination thereof. In an embodiment of the invention, the plurality of airgaps 190, or any airgap of the plurality of airgaps 190 for that matter, may extend into the buffer oxide layer as further disclosed herein.

The systems, processes and methods conceived by the inventors include steps to fabricate airgaps within the structure of a gate structure and to form a cobalt silicide layer. The inventors have discovered that airgaps suppress WL to WL capacitance leading to reduced WL interference and the cobalt silicide layer decreases WL resistance for avoiding resistive-capacitive (RC) delay. Furthermore, the invention is directed to a gate structure having integrated airgaps and a cobalt silicate layer that maintains its resilience and is not subject to an increased risk of substrate damage. Furthermore, the inventive semiconductor device and methods of manufacture thereof yields a gate structure having substantially no remaining cobalt residue.

A method of fabricating a gate structure of the invention may include various steps to achieve a finished structure similar to the exemplary embodiment illustrated in FIG. 12. For example, a gate structure illustrated in FIG. 1 may be provided and subjected to additional processing steps to achieve the finished structure illustrate in FIG. 13. The gate structure 1 of FIG. 1 has a plurality of gates 10 disposed on a substrate 20 and defined by a space 30. The WL spaces 40 of FIG. 1, or network of spaces, define a dense WL region 100. The substrate 20 may comprise silicon, germanium, silicon germanium, semiconductor compounds, or other known semiconductor materials. The space 30 or WL spaces 40 may be formed using any conventional technique known in the art.

The plurality of gates 10 generally each comprises a first dielectric layer, a first conductive layer, a second dielectric layer, and a second conductive layer. More specifically, the first dielectric layer may be a tunnel oxide layer 50, the first conductive layer may be a floating gate layer 60, the second dielectric layer may be an oxide/nitride/oxide (ONO) laminate layer 70, and the second conductive layer may be a control gate layer 80, although the steps of the invention may be applied to other semiconductor devices having differently configured transistors and/or components. A cap layer 90, such as a hard mask oxide, may be patterned and etched such that the cap layer 90 is disposed on the control gate layer 80.

Figure 2:
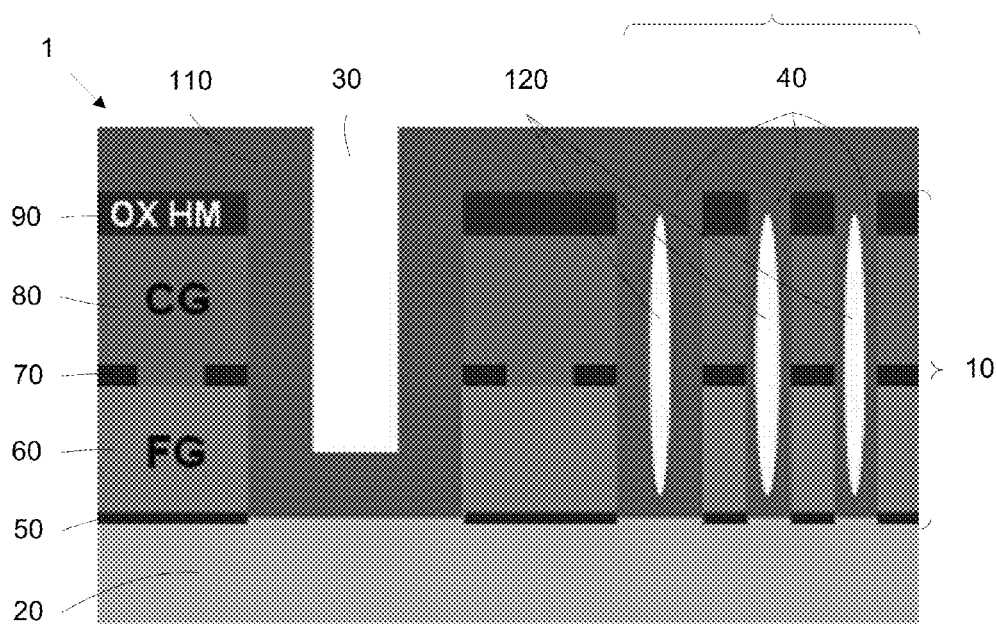
FIG. 2 illustrates a cross-sectional view of a gate structure following a deposition to form voids in a disposed layer according to an embodiment of the invention.

A deposition step is performed on the gate structure 1 such that void spaces are formed in the WL spaces of dense WL region. According to an embodiment of the invention, FIG. 2 illustrates a cross-sectional view of the gate structure following a deposition to form voids in a disposed layer. A deposition layer 110 is disposed across the gate structure 1 in such a manner that void spaces 120 are formed in the WL spaces 40 of the dense WL region 100. According to certain embodiments of the invention, more than one deposition layer 110 is applied to the gate structure 1. In certain embodiments of the invention, such as that represented by the exemplary embodiment illustrated in FIG. 2, an excess of material may be deposited to ensure that any gaps in spaces outside of the WL region are filled.

In certain embodiments of the invention, a chemical vapor deposition (CVD) process is used to form a series of void spaces, in particular, within the WL spaces 40 of a dense WL region 100. The deposition layer 110 may be disposed using any CVD technique. Examples of CVD processes that may be used to form the void spaces 120 include plasma deposition, thermal deposition, as well as any other CVD process known in the art. Indeed any deposition technique may be used to form the deposition layer 110 as long as void spaces 120 are formed in the WL spaces 40 of the dense WL region 100.

Other examples of CVD to form void spaces 120 include the enhanced high aspect ratio process (eHARP) chamber for chemical vapor deposition; high density plasma deposition such as high density plasma chemical vapor deposition; plasma enhanced oxide (PEOX) process; undoped silicon glass using, for example, chemical vapor deposition; tetraethoxysilane (TEOS) deposition; and hot temperature oxide (HTO) film deposition.

The deposition layer 110 comprises a dielectric material. In an embodiment of the invention, the deposition material is an oxide. In certain embodiments of the invention, the deposition layer 110 may comprise at least one of a silicon oxide, a silicon nitride, other high-K material, and any combination thereof. In certain embodiments of the invention, one type of silicon oxide may be deposited. In certain other embodiments of the invention, more than one type of silicon oxide may be deposited.

Figure 3:
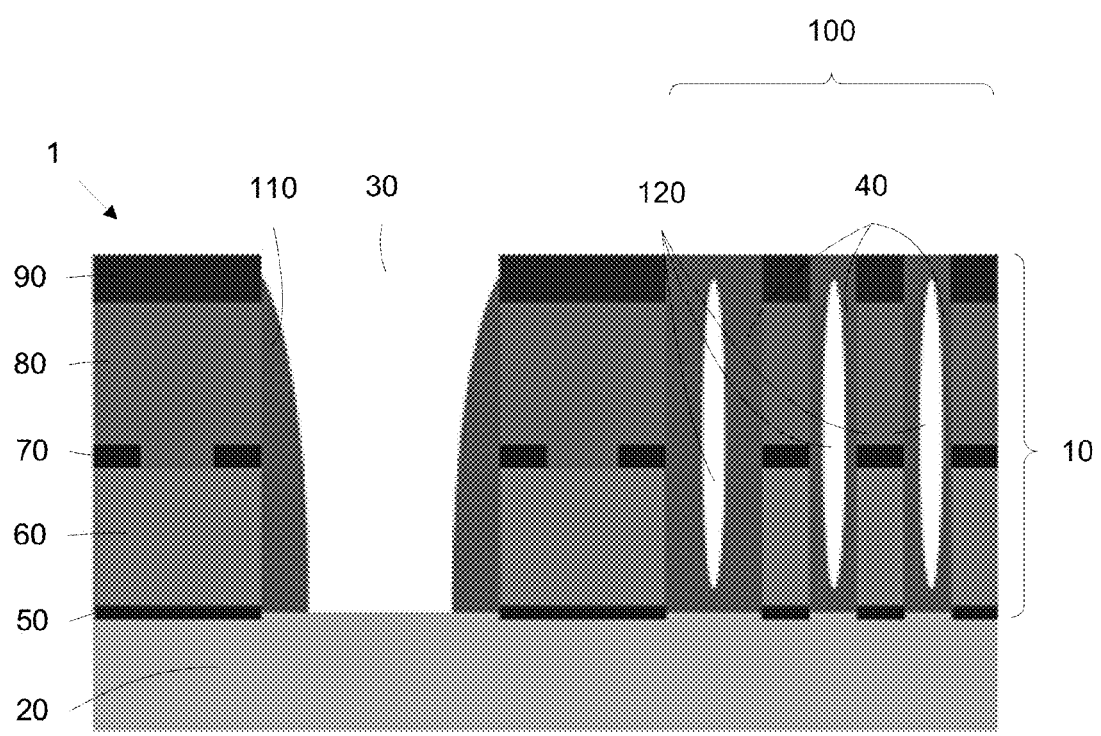
FIG. 3 illustrates a cross-sectional view of a gate structure following an etch process according to an embodiment of the invention.

According to an embodiment of the invention, at least a portion of the deposition layer 110 is removed from the gate structure 1. Specifically, any excess material deposited on the gate structure 1 may be removed. FIG. 3 illustrates a cross-sectional view of a gate structure following an etch process. The deposition layer 110 is etched backed but without opening the void spaces 120 that have been formed in the WL spaces 40 of the dense WL region 100. The etch back causes a sidewall spacer to be formed in space 30. Any etching process know in the art may be used. In non-limiting examples, the etching process may be a dry etching process or a wet etching process. Non-limiting examples of dry etching processes include plasma etching, sputter etching, ionization etching, and reactive ion etching. Non-limiting examples of wet etch processes include chemical vapor etching, metal assisted etching, and electroless etching. For example, chemical vapor etching may be performed using an acidic etching solution such as mixtures of $HNO_3$ and HF.

In certain embodiments of the invention, the etching process may be a selective etching process where the deposition layer 110 is preferably removed. In other embodiments of the invention, a mask may be applied to achieve selection etching. In yet other embodiments of the invention, the deposition layer 110 may be removed by other processes, including, for example, a chemical mechanical planarization (CMP) process. In certain other embodiments of the invention, the deposition layer 110 may be removed by the use of several processes. In a non-limiting example, a portion of the deposition layer 110 may be removed by a CMP process and another portion of the deposition layer is removed by an etch back process.

Once at least a portion of the deposition layer 110 is removed, a first interlayer dielectric (ILD1) is applied to the gate structure 1. The first interlayer dielectric may include one or more layers. In certain embodiments of the invention, the first interlayer dielectric may be a void-free interlayer dielectric that is substantially free of any voids. According to an embodiment, the first interlayer dielectric is deposited across the gate structure and fills any gaps between the gates.

Figure 4:
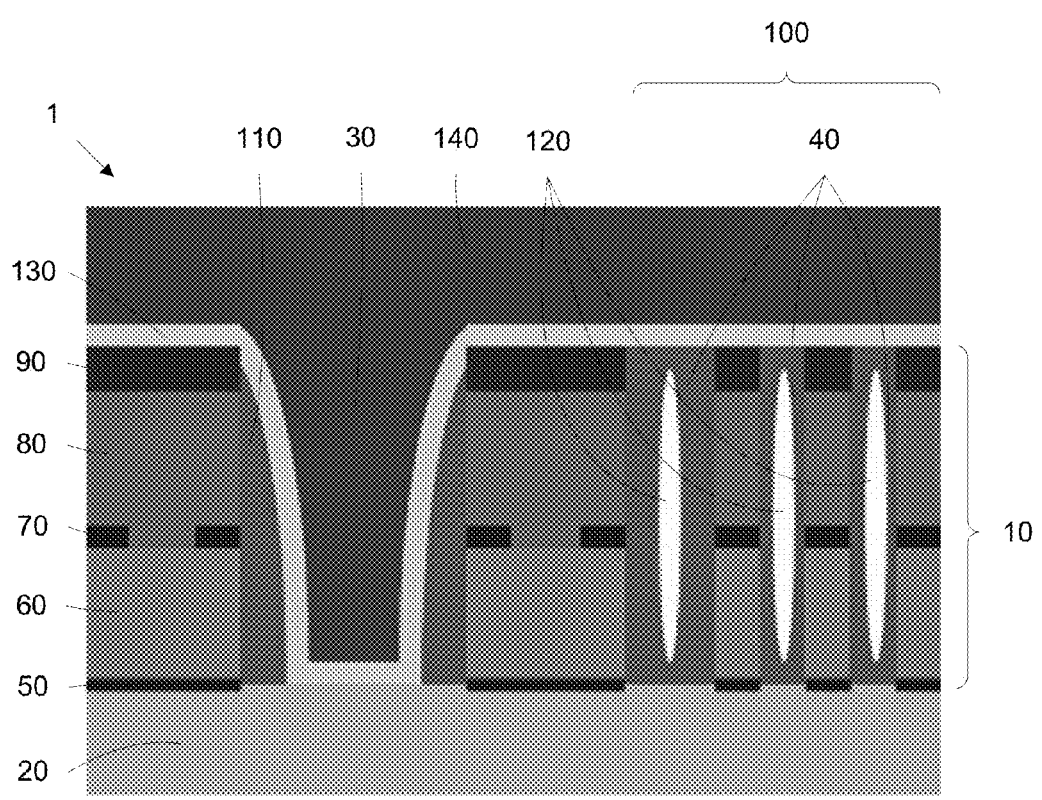
FIG. 4 illustrates a cross-sectional view of a gate structure following formation of a dielectric interlayer according to an embodiment of the invention.

FIG. 4 is a cross-sectional view of a gate structure following formation of the first interlayer dielectric. In the exemplary embodiment represented by FIG. 4, a series of deposition processes are used to form the first interlayer dielectric. According to the exemplary embodiment of FIG. 4, the first interlayer dielectric may comprise a buffer oxide layer and a liner silicon nitride (SiN) film 130 are each disposed across the gate structure 1. According to this exemplary embodiment, a high density plasma (HDP) dielectric material 140 is disposed on the gate structure 1 substantially filling any gaps that exist between the plurality of gates 10 of the gate structure 1. In some embodiments of the invention, the HDP dielectric material 140 is applied such that it overfills any gaps that may exist between the plurality of gates 10 of the gate structure 1.

Figure 5:
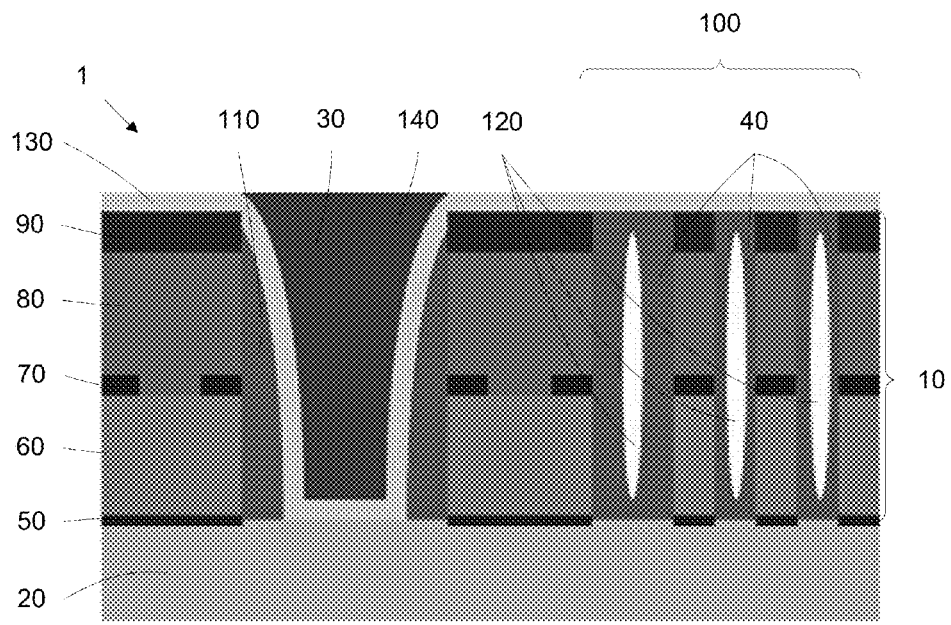
FIG. 5 illustrates a cross-sectional view of a gate structure following removal of excess dielectric material according to an embodiment of the invention.

In an embodiment of the invention, the excess HDP material is removed from the gate structure. FIG. 5 illustrates a cross-sectional view of the gate structure following removal of excess dielectric material. The excess HDP dielectric material 140 may be removed by any known process for removing material from a semiconductor device. In an embodiment of the invention, the excess HDP dielectric material 140 is removed by a CMP process. In another embodiment of the invention, the excess HDP dielectric material 140 is removed by an etch back process. In certain embodiments of the invention, the etch back process may be a selective etch back process. In some embodiments of the invention, a combination of processes may be used to remove the excess HDP dielectric material 140. In a non-limiting example, the excess HDP dielectric material 140 may be removed by a CMP process and an etch back process.

Partial deposition of the HDP dielectric material 140 followed by etch back of the excess material deposited near the top of the space may be useful to eliminate the formation of voids following a complete fill. In certain embodiments of the invention, more than one partial deposition of HDP dielectric material 140 followed by etching may be employed.

In an embodiment of the invention, excess HDP dielectric material 140 is removed to expose the buffer oxide layer and the liner silicon nitride (SiN) film 130 at the upper layer of the gate structure 1. In some embodiments of the invention, following the removal of excess HDP dielectric material, some HDP dielectric material 140 continues to fill gaps that would otherwise exist between the plurality of gates 10. In the exemplary embodiment represented by FIG. 5, the space 30 comprises a sidewall spacer formed by the deposition layer 110 with the buffer oxide layer and the liner silicon nitride (SiN) film 130 disposed across the surfaces. The HDP dielectric material 140 fills the remaining open portion of the space 30 according to this exemplary embodiment.

Figure 6:
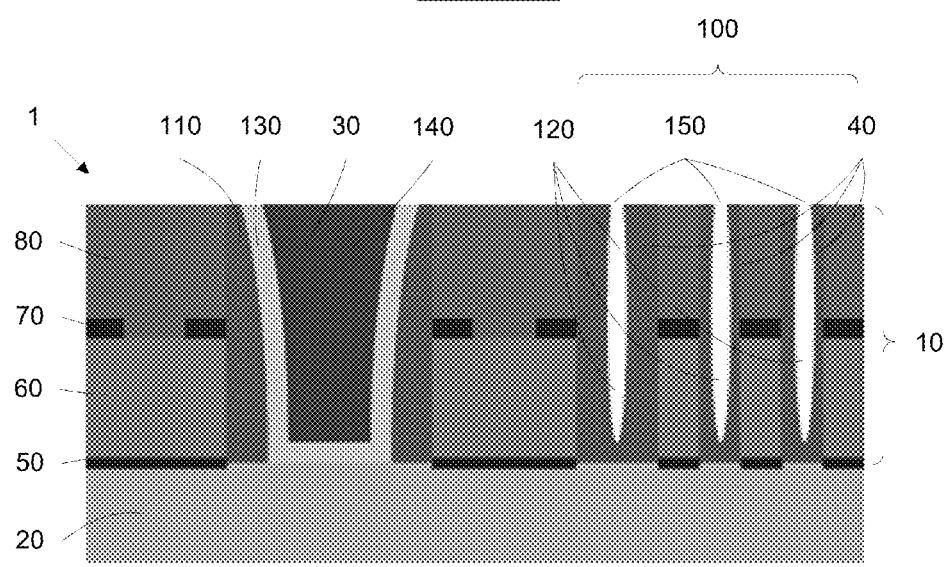
FIG. 6 illustrates a cross-sectional view of a gate structure following the removal of upper portions of the gate structure to open the void spaces according to an embodiment of the invention.

Following the removal of excess HDP dielectric material 140, the upper layers of the gate structure 1 are removed until an opening is formed in the void spaces 120. FIG. 6 illustrates a cross-sectional view of a gate structure following the removal of upper portions of the gate structure to open the void spaces.

Portions of the buffer oxide layer and the liner silicon nitride (SiN) film 130, the HDP dielectric material 140, the deposition layer 110, and the cap layer 90 may have been removed from the upper surface of the gate structure 1 to form openings 150 in the void spaces 120. In an embodiment of the invention, substantially the entire cap layer 90 may have to be removed to form openings 150 in the void spaces 120. In certain embodiments of the invention, a portion of the control gate layer 80 may have to be removed to form openings 150 in the void spaces 120.

In an embodiment of the invention, openings 150 may be formed in the void spaces 120 by an etch back process. In another embodiment of the invention, openings 150 may be formed in the void spaces 120 by a CMP process. In certain embodiments of the invention, openings 150 may be formed in the void spaces 120 using a combination of processes. In a non-limiting example, openings 150 may be formed in the void spaces 120 using a CMP process and an etch back process.

Figure 7:
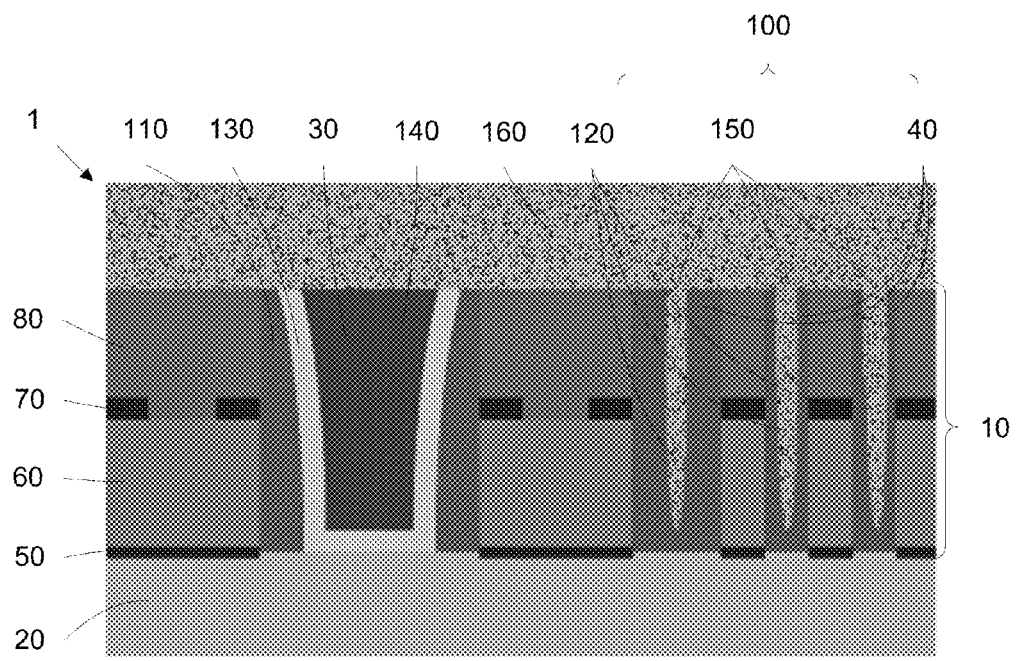
FIG. 7 illustrates a cross-sectional view of a gate structure following a deposition to fill the void spaces according to an embodiment of the invention.

After openings 150 are formed in the void spaces 120, another layer is applied to the gate structure 1. This layer provides a fill material for the void spaces 120. FIG. 7 illustrates a cross-sectional view of the gate structure 1 following a deposition to fill the void spaces 120. In an embodiment of the invention the material for filling in the void spaces 120 is a spin-on dielectric (SOD) material 160. In an embodiment of the invention, the SOD material 160 is applied such that it overfills the void spaces 120. In certain embodiments of the invention, SOD material 160 may overfill the void spaces 120 to form a layer having a thickness of anywhere from about several hundred angstroms to about several thousand angstroms.

In certain embodiments of the invention, the SOD material 160 may be applied to the gate structure 1 using a spin-on process having a high rotational velocity. For example, the spin-on dielectric may be applied at a velocity of several thousand rpm. Optionally, a precursor spin-on process and edge bevel rinse process may first be performed on the gate structure 1. The gate structure 1 on which the SOD material 160 has been disposed may be subjected to a soft bake process. Without intending to be bound by theory, the soft bake will cause solvent contained within the SOD material 160 applied to the gate structure 1 to be removed.

A soft bake process is typically performed in on the order of several minutes. In certain embodiments of the invention, the soft bake may utilize anywhere from one to three hot plates. In an embodiment where more than one hot plate is used, the hot plates may be fixed at varying temperatures. The temperature of a hot plate may be in the range from about 50° C. to about 250° C. In certain embodiments of the invention, three hot plates may be used having temperatures fixed at about 150° C., about 200° C., and about 250° C., respectively.

Following soft bake, the SOD material 160 applied to the gate structure 1 may be subjected to a curing process. In certain embodiments of the invention, the curing process may last anywhere from about 3 to about 5 minutes; however, a curing time of up to about 10 minutes may be required. In certain embodiments of the invention, the gate structure 1 may be cured in a sealed chamber having an oxygen content of no more than about 100 ppm. The temperature at which curing is performed may be anywhere in a range of from about 350° C. to about 500° C. Following curing, the gate structure 1 is allowed to cool. In certain embodiments of the invention, the gate structure is cooled to a temperature in a range of from about 15° C. to about 35° C.

Figure 8:
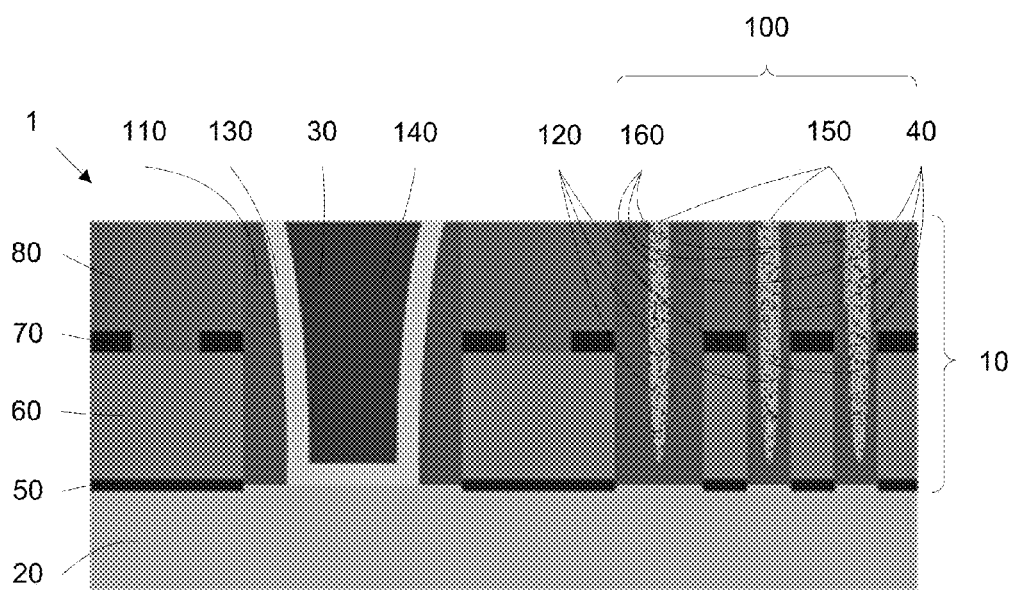
FIG. 8 illustrates a cross-sectional view of a gate structure following the removal of excess fill material according to an embodiment of the invention.

Following application and any further processing of the SOD material 160, excess SOD material may be removed from the gate structure 1. A cross-sectional view of the gate structure 1 following removal of the excess filling material is illustrated in FIG. 8. Excess SOD material 160 from the SOD layer may be removed by any of a polishing process, an etch back process, and combinations thereof. In certain embodiments of the invention, excess SOD material 160 may be removed from the SOD layer using a CMP process. In certain embodiments of the invention, excess SOD material 160 may be removed from the SOD layer by the use of an etching process similar to etch back processes or any other etching method disclosed hereon. Indeed, any etching process know in the art may be used to remove the excess SOD material 160 from the SOD layer.

In an embodiment of the invention, excess SOD material 160 is removed from the SOD layer until reaching the openings 150 in the void spaces 120 similar to the exemplary embodiment represented by FIG. 8.

In certain embodiments of the invention, the gate structure 1 may be subjected to additional applications of the dielectric material, such as the SOD material, and polishing and/or etch back operations to ensure any gaps that may exist in the void spaces 120 are completely filled.

Figure 9:
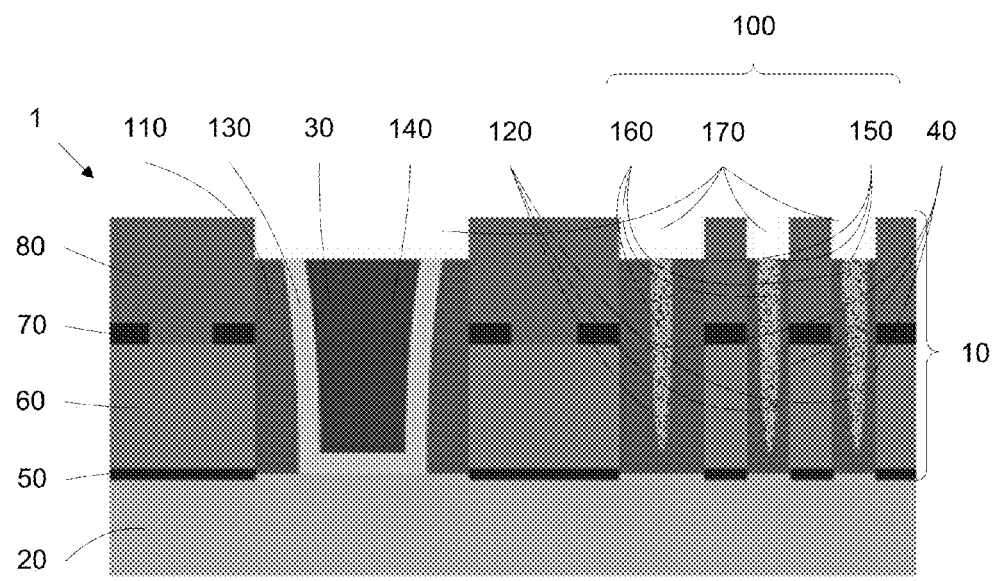
FIG. 9 illustrates a cross-sectional view of a gate structure following a selective etch to form an oxide recess according to an embodiment of the invention.

Following filling of the void spaces 120, the gate structure 1 is subjected to a selective etch to form oxide recesses 170 in the space 30 and WL spaces 40 of the gate structure 1. FIG. 9 illustrates a cross-sectional view of a gate structure following a selective etch to form oxide recesses. In certain embodiments of the invention, a mask may be used in the selective etching process to form the oxide recesses 170. In positive masking, the portions of a resist material exposed by the mask remain following etching. In negative masking, the portions of the resist material exposed by the mask are removed following etching.

Figure 10:
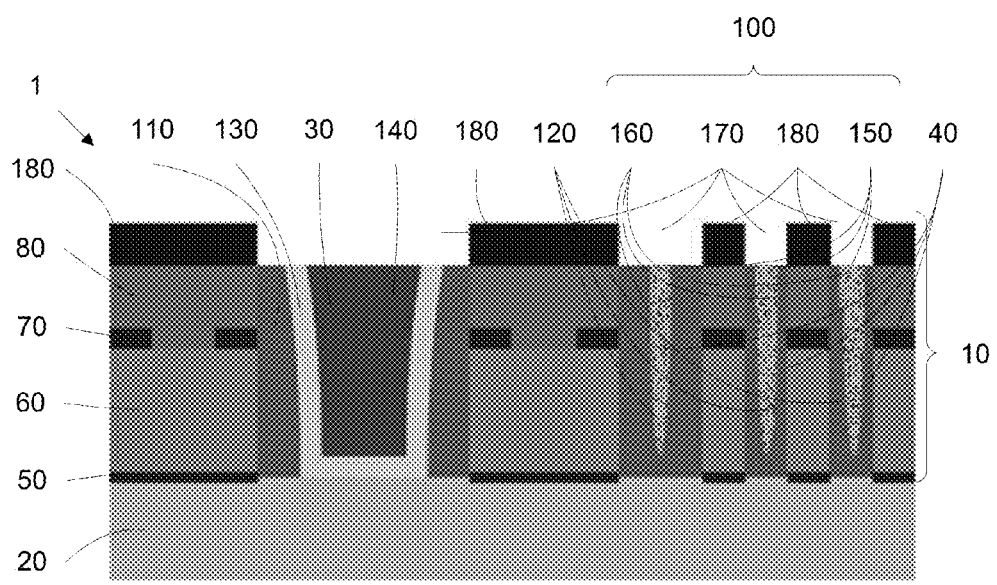
FIG. 10 illustrates a cross-sectional view of a gate structure following formation of a silicide layer according to an embodiment of the invention.

Following the formation of oxide recesses 170 in the gate structure 1, a cobalt silicide layer is formed across the control gate 80 of the plurality of gates 10. FIG. 10 illustrates a cross-sectional view of the gate structure 1 following formation of the silicide layer 180. In certain embodiments of the invention, the silicide layer 180 may be a cobalt containing silicide layer.

The silicide layer 180 may be formed according to any technique known in the art. In an exemplary embodiment of the invention, a layer of cobalt is deposited across the gate structure 1. A first rapid thermal process (RTP1) may then be performed. RTP1 typically involves exposing the gate structure 1 with the applied layer of cobalt to an elevated temperature for some amount of time. In certain embodiments of the invention, the gate structure 1 with the applied layer of cobalt may be exposed to a temperature in a range of from about 400° C. to about 680° C. for on the order of from about 10 seconds to about 40 seconds.

In certain embodiments of the invention, the temperature is rapidly increased to the RTP1 processing temperature in a range of from about 400° C. to about 680° C. within a very quick time—perhaps on the order of about 10 seconds. The RTP1 processing temperature is maintained for on the order of about 10 second to about 40 seconds. Finally, the temperature is then quickly reduced. Without intending to be bound by theory, RTP1 causes cobalt to react with silicon in the control gate 80 to form CoSi and $Co_2Si$. Perhaps, to some minor extent depending upon the severity of RTP1, CoSi2 may also be performed. $CoSi_2$ possesses the lowest resistance of the combinations and is preferred in a finished silicide layer.

Following RTP1, the gate structure 1 may be subjected to a selective etch to remove unreacted cobalt leaving behind a layer of reacted material. Because the cobalt prefers to react with silicon in the polysilicon of the control gate 80 and not necessarily any silicon in the deposition layer 110, the SiN film 130, the HDP dielectric material 140, or the SOD material 160 contained within the void spaces 120, a profile resembling the structure in the exemplary embodiment of FIG. 10 begins to take shape.

Following the selective etch, the gate structure 1 may then be subjected to a second rapid thermal process (RTP2). RTP2 typically involves exposing the gate structure 1 with reacted cobalt and silicon layer to an elevated temperature, typically a temperature higher than that for RTP1, for some amount of time, typically an amount of time higher than that for RTP1. In certain embodiments of the invention, the gate structure 1 with the reacted cobalt and silicon layer may be exposed to a temperature in a range of from about 700° C. to about 950° C. for on the order of from about 30 seconds to about 60 seconds.

In certain embodiments of the invention, the temperature is rapidly increased to the RTP2 processing temperature in a range of from about 700° C. to about 950° C. within a very quick time—perhaps on the order of about 10 seconds to about 20 seconds. The RTP2 processing temperature is maintained for on the order of about 30 second to about 60 seconds. Finally, the temperature is then quickly reduced. Without intending to be bound by theory, RTP2 converts CoSi and $Co_2Si$ to $CoSi_2$ imparting lower resistance to the silicide layer 180.

One exemplary method for forming a silicide layer 180 has been described herein. But any method known in the art for forming the silicide layer may be used to form the silicide layer 180. In certain embodiments of the invention, the silicide layer may be formed using a plurality of rapid thermal processes. In another exemplary embodiment three rapid thermal processes are employed, the first RTP at a temperature in a range from about 300° C. to about 500° C. for about 10 seconds to about 50 seconds, the second RTP at a temperature in a range from about 400° C. to about 680° C. for about 20 seconds to about 50 seconds, and the third RTP at a temperature in a range from about 700° C. to about 950° C. for about 30 seconds to about 60 seconds.

Figure 11:
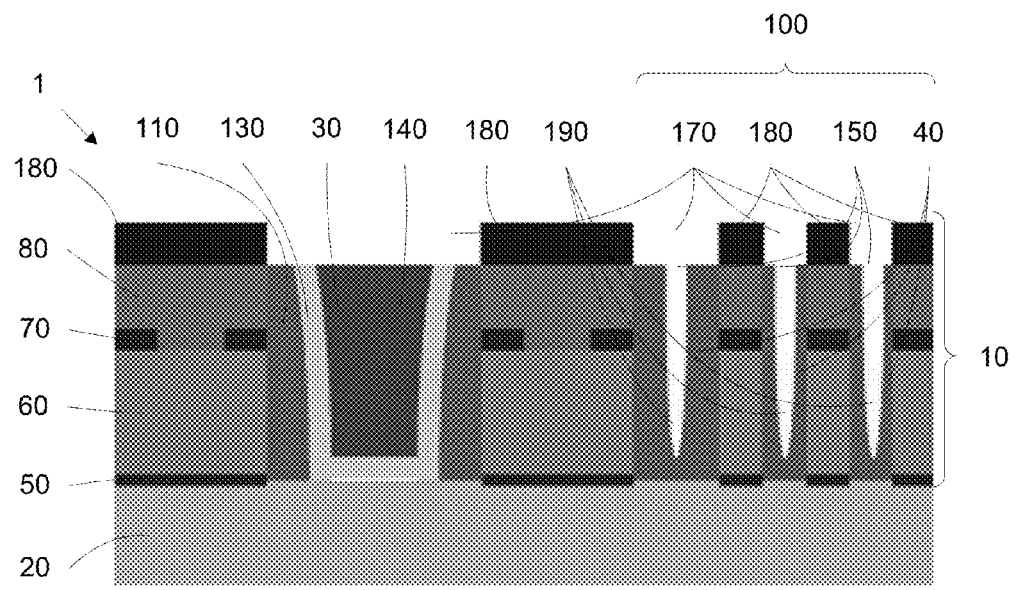
FIG. 11 illustrates a cross-sectional view of a gate structure following removal of the fill material to form a plurality of airgaps according to an embodiment of the invention.

Following the formation of the silicide layer 180, the SOD material 160 is removed from the void spaces 120 to form a plurality of airgaps 190. A cross-sectional view of the gate structure 1 following removal of the fill material from the void spaces 120 to form a plurality of airgaps 190 is shown in FIG. 11. In an embodiment of the invention, a wet etch process may be used to remove the SOD material 160 from the void spaces 120 to form the plurality of airgaps 190. In certain embodiments of the invention, the conditions of the wet etch process and the solvent used in the wet etch process may be chosen such that a wet etch rate of the SOD material 160 is greater than a wet etch rate of the material of the deposition layer 110, which was used to define the void spaces 120. Under such conditions, for instance, the profile shown in the exemplary embodiment of FIG. 11 may be formed.

In certain embodiments of the invention, the wet etch process may be a hydrofluoric acid (HF) etching process, an etching process using a buffered oxide etchant (BOE), or an etching process using a buffered hydrofluoric acid (BHF).

A second interlayer dielectric (ILD2) may then be applied to the gate structure 1. The second interlayer dielectric may include one or more layers. According to an embodiment, the first interlayer dielectric is deposited across the gate structure and fills any gaps between the gates but is applied in such a manner as to maintain the structure of the plurality of airgaps 190.

FIG. 12 illustrates a cross-sectional view of a gate structure following formation of a second interlayer dielectric. In an embodiment of the invention, the second interlayer dielectric comprises a buffer oxide layer 200. In certain embodiments of the invention, the buffer oxide layer 200 may be conformally applied the gate structure 1 except that the buffer oxide layer 200 is applied using fabrication techniques such that the buffer oxide material is not deposited in the plurality of airgaps 190 or the plurality of airgaps 190 do not become filled with the buffer oxide material similar to the profile shown in the exemplary embodiment represented by FIG. 12.

Suitable masking and fabrication techniques known in the art may be used to apply the buffer oxide layer 200 in such a manner as to allow the plurality of airgaps 190 to maintain their form and perhaps even extend into the buffer oxide layer 200 similar to the exemplary embodiment represented by FIG. 12. In certain embodiments of the invention, the plurality of airgaps 190 may extend only to about the interface of the deposition layer 110 and the buffer oxide layer 200 (not shown in FIG. 12). In certain embodiments of the invention, the plurality of airgaps 190 extend through about $1/10^{th}$, about $1/4^{th}$, about $1/3^{rd}$, about $1/2$, about $2/3^{rd}$, or about $3/4^{th}$ of the buffer oxide layer 200.

The second interlayer dielectric may additionally comprise a liner silicon nitride (SiN) film 210 deposited over the buffer oxide layer 200. In certain embodiments of the invention, the liner SiN film 210 is applied conformally over the buffer oxide layer 200 similar to the profile shown in the exemplary embodiment represented by FIG. 12.

The second interlayer dielectric may also comprise a silicon oxide layer 220 deposited on the SiN film 210. In certain embodiments, the silicon oxide layer 220 is deposited such that it substantially fills any gaps in the gate structure 1 as shown in the exemplary embodiment of FIG. 12. In certain embodiments of the invention, the second interlayer dielectric may comprise an undoped silicon glass (USG) layer.

Figure 1:
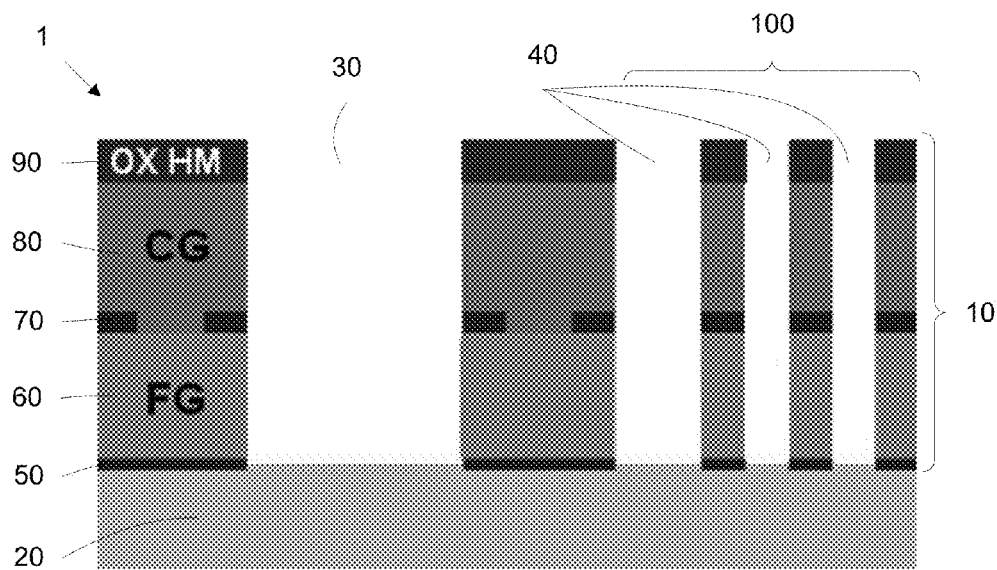
FIG. 1 illustrates a cross-sectional view of a portion of a gate structure.
Figure 13:
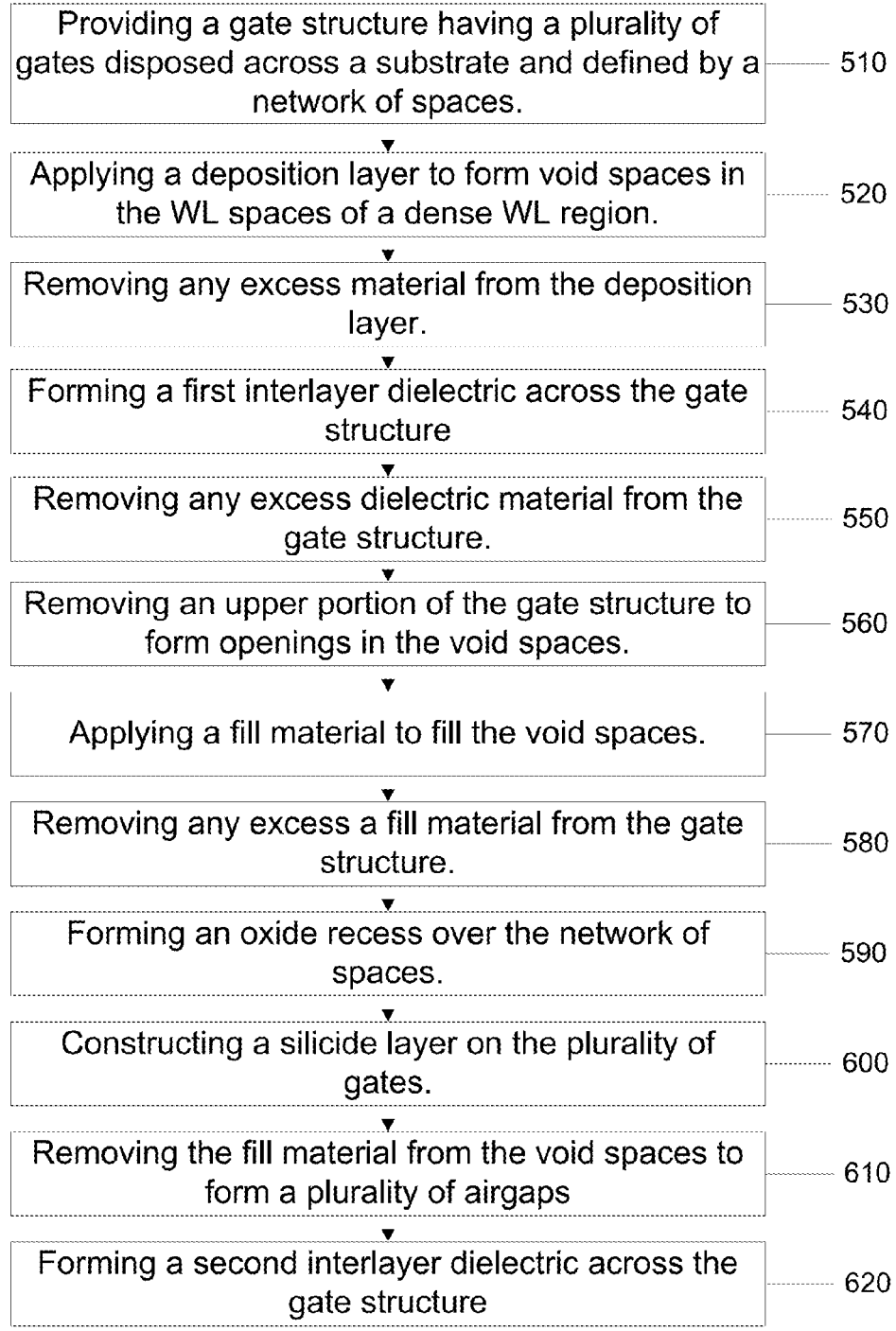
FIG. 13 illustrates a flowchart showing the steps for fabricating a gate structure having a plurality of airgaps according to an embodiment of the invention.

FIG. 13 illustrates a flowchart showing the steps for fabricating a gate structure having a plurality of airgaps. A gate structure having a plurality of gates disposed across a substrate and defined by a space 510 or, more aptly, a network of spaces similar to that shown in FIG. 1 is provided. The exemplary method for fabricating a gate structure having a plurality of airgaps 500 may comprise the steps of applying a deposition layer to form void spaces in the WL spaces of a dense WL region of the gate structure 520 and removing at least a portion of the deposition layer 530. According to certain embodiments of the invention, the deposition layer may be applied by a CVD process.

The exemplary method for fabricating a gate structure having a plurality of airgaps 500 may comprise the step of forming a first interlayer dielectric across the gate structure 540. A first interlayer dielectric (IDL1) as further disclosed herein may be formed across the gate structure.

The exemplary method for fabricating a gate structure having a plurality of airgaps 500 may additionally comprise the steps of removing excess dielectric material from the gate structure 550 and removing an upper portion of the gate structure to form openings in the void spaces 560. The exemplary method may also comprise applying a fill material to fill the void spaces 570. Any excess fill material applied to the gate structure may then be removed from the gate structure 580. In an embodiment of the invention, the fill material may comprise a spin-on dielectric material.

The exemplary method for fabricating a gate structure having a plurality of airgaps 500 may additionally comprise the steps of forming an oxide recess over a plurality of spaces of the gate structure 590 and constructing a silicide layer on the plurality of gates 600 of the gate structure. The silicide layer may comprise cobalt according to certain embodiments of the invention.

The step of removing the fill material from the void spaces to form a plurality of airgaps 610 may follow the formation of the silicide layer. The exemplary method for fabricating a gate structure having a plurality of airgaps 500 may then include the step of forming a second interlayer dielectric across the gate structure 620. For example, a second interlayer dielectric (IDL2) as further disclosed herein may be formed across the gate structure.

An aspect of the invention provides a semiconductor having an airgap fabricated using the processes or methods for fabricating a semiconductor having an airgap of the invention.

In certain other embodiments of the invention, a semiconductor device may be fabricated using any methods as described herein.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of fabricating a gate structure comprising:
   providing a gate structure assembly having a plurality of gates disposed across a substrate defined by a network of spaces, the gate structure assembly defined by a dense word line (WL) region;
   applying a deposition layer to form void spaces in any space of the dense WL region;
   forming a first interlayer dielectric across the gate structure;
   removing a cap layer disposed on the gate structure to form openings in the void spaces;
   constructing a silicide layer on the plurality of gates; and
   forming a second interlayer dielectric across the plurality of gates, wherein the second interlayer dielectric comprises a buffer oxide layer, silicon nitride film, and at least one of a silicon oxide layer and an undoped silicon glass layer.

2. The method of claim 1, additionally comprising:
   applying a fill material to fill the void spaces;
   removing any excess fill material from the gate structure; and
   forming an oxide recess over the network of spaces.

3. The method of claim 2, additionally comprising removing the fill material from the void spaces to form a plurality of airgaps.

4. The method of claim 2, wherein the fill material is a spin-on dielectric material.

5. The method of claim 4, wherein applying a fill material to fill the void spaces comprises:
   spinning on the spin-on dielectric material;
   baking the spin-on dielectric material using a soft bake process; and
   curing the spin-on dielectric material.

6. The method of claim 1, wherein the deposition layer is applied using a chemical vapor deposition (CVD) process.

7. The method of claim 1, wherein the silicide comprises cobalt.

8. The method of claim 7, wherein constructing a silicide layer on the plurality of gates comprises:
   applying a layer of cobalt across the gate structure;
   heating the control gate using a first rapid thermal process;
   removing unreacted cobalt from the gate structure; and heating the control gate using a second rapid thermal process.

9. The method of claim 8, wherein the first rapid thermal process operates at a temperature in a range of from about 400° C. to about 680° C. for an amount of time in a range of from about 10 seconds to about 40 seconds.

10. The method of claim 8, wherein the second rapid thermal process operates at a temperature in a range of from about 700° C. to about 950° C. for an amount of time in a range of from about 30 seconds to about 60 seconds.

11. A method of fabricating a gate structure comprising:
providing a gate structure assembly having a plurality of gates disposed across a substrate defined by a network of spaces, the gate structure assembly defined by a dense word line (WL) region;
applying a deposition layer to form void spaces in any space of the dense WL region;
forming a first interlayer dielectric across the gate structure;
removing a cap layer disposed on the gate structure to form openings in the void spaces;
applying a fill material to fill the void spaces;
constructing a silicide layer on the plurality of gates;
removing the fill material from the void spaces to form a plurality of airgaps; and
forming a second interlayer dielectric across the airgaps, wherein the second interlayer dielectric comprises a buffer oxide layer, silicon nitride film, and at least one of a silicon oxide layer and an undoped silicon glass layer, and
wherein the airgaps extend into the second interlayer dielectric.

* * * * *